(12) United States Patent
Hoffmann et al.

(10) Patent No.: US 7,855,929 B2
(45) Date of Patent: Dec. 21, 2010

(54) APPARATUS FOR THE DYNAMIC DETECTION, SELECTION AND DESELECTION OF LEAKING DECOUPLING CAPACITORS

(75) Inventors: Jochen Hoffmann, Colchester, VT (US); Steffen Loeffler, Cary, NC (US)

(73) Assignee: Qimonda AG, Munich (DE)

( * ) Notice: Subject to any disclaimer, the term of this patent is extended or adjusted under 35 U.S.C. 154(b) by 92 days.

(21) Appl. No.: 12/239,624

(22) Filed: Sep. 26, 2008

(65) Prior Publication Data

US 2010/0080043 A1  Apr. 1, 2010

(51) Int. Cl.
*G11C 7/00* (2006.01)

(52) U.S. Cl. ........................ 365/222; 365/226

(58) Field of Classification Search ................. 365/222, 365/226
See application file for complete search history.

(56) References Cited

U.S. PATENT DOCUMENTS

| | | | | |
|---|---|---|---|---|
| 5,801,412 A | * | 9/1998 | Tobita | 257/296 |
| 7,388,774 B1 | * | 6/2008 | Kim | 365/154 |
| 7,542,331 B1 | * | 6/2009 | Kim | 365/154 |
| 7,542,332 B1 | * | 6/2009 | Kim | 365/154 |
| 2002/0064065 A1 | * | 5/2002 | Salling | 365/145 |
| 2005/0026354 A1 | * | 2/2005 | Bhattacharyya | 438/232 |
| 2006/0131650 A1 | * | 6/2006 | Okhonin et al. | 257/347 |

* cited by examiner

*Primary Examiner*—Michael T Tran
(74) *Attorney, Agent, or Firm*—Patterson & Sheridan, LLP

(57) ABSTRACT

Embodiments of the invention generally related to arrangements of decoupling capacitor arrays in an integrated circuit. A decoupling capacitor array may include a plurality of bit lines that are electrically coupled to each other, a plurality of word lines that are electrically coupled to each other, and a plurality of decoupling capacitors, each decoupling capacitor coupled to a respective bit line and word line. The decoupling capacitor array may further include an access circuit electrically coupled to the plurality of word lines and a power grid, the access circuit being configured to either connect or disconnect the decoupling capacitor array to the power grid based on a control signal.

19 Claims, 13 Drawing Sheets

APPARATUS FOR THE DYNAMIC DETECTION, SELECTION AND DESELECTION OF LEAKING DECOUPLING CAPACITORS

BACKGROUND OF THE INVENTION

Advances in semiconductor fabrication have allowed millions of circuit elements such as transistors to be placed on a single integrated circuit. Such densely packed integrated circuits typically operate at low power and high frequencies. During operation of an integrated circuit, transistors contained therein may be continuously switched, thereby rapidly changing currents flowing within the integrated circuit. The availability of current for switching operations may affect one or more voltages associated with the integrated circuit. Therefore, if sufficient current is not available for the switching operations, voltage fluctuations may erroneously change the state of the integrated circuit or integrated circuit components.

To provide sufficient current during switching of transistors, decoupling capacitors may be placed at strategic locations on power consuming circuits. For example, in a Dynamic Random Access Memory (DRAM), a matrix of array capacitors may be placed at one or more locations along the power grid where current spikes may be likely. Placing localized decoupling capacitors along the power grid near a circuit element provides a source of current during spikes in current requirements. Therefore, effects of voltage fluctuations may be made less severe. For example, when a greater amount of current is desired, electrical charge stored in the capacitor may flow to the circuit element, thereby providing an additional source of current. Providing additional current may make reduce or eliminate voltage fluctuations.

SUMMARY

The present invention is generally related to decoupling capacitors, and more specifically to arrangements of decoupling capacitor arrays.

One embodiment of the invention provides a decoupling capacitor array, generally comprising a plurality of bit lines, wherein the plurality of bit lines are electrically coupled to each other, a plurality of word lines, wherein the plurality of word lines are electrically coupled to each other, a plurality of decoupling capacitors, each decoupling capacitor coupled to a respective bit line and word line. The decoupling capacitor array further comprises an access circuit electrically coupled to the plurality of word lines and a power grid, wherein the access circuit is configured to either connect or disconnect the decoupling capacitor array to the power grid based on a control signal.

Another embodiment of the invention provides a method for providing decoupling capacitance. The method generally comprises connecting a decoupling capacitor array to a power grid of a system, wherein each decoupling capacitor array comprises a plurality of bit lines, wherein the plurality of bit lines are electrically coupled to each other, a plurality of word lines, wherein the plurality of word lines are electrically coupled to each other, and a plurality of decoupling capacitors, each decoupling capacitor coupled to a respective bit line and word line. The decoupling capacitor array further comprises an access circuit electrically coupled to the plurality of word lines and a power grid, wherein the access circuit is configured to either connect or disconnect the decoupling capacitor array to the power grid based on a control signal.

Yet another embodiment of the invention provides a system, generally comprising a power grid, a plurality of circuit elements coupled to the power grid, the circuit elements comprising one or more transistors, and a plurality of decoupling capacitor arrays coupled to the power grid. Each decoupling capacitor array generally comprises a plurality of bit lines, wherein the plurality of bit lines are electrically coupled to each other, a plurality of word lines, wherein the plurality of word lines are electrically coupled to each other, and a plurality of decoupling capacitors, each decoupling capacitor coupled to a respective bit line and word line. Each decoupling capacitor array further comprises an access circuit electrically coupled to the plurality of word lines and a power grid, wherein the access circuit is configured to either connect or disconnect the decoupling capacitor array to the power grid based on a control signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
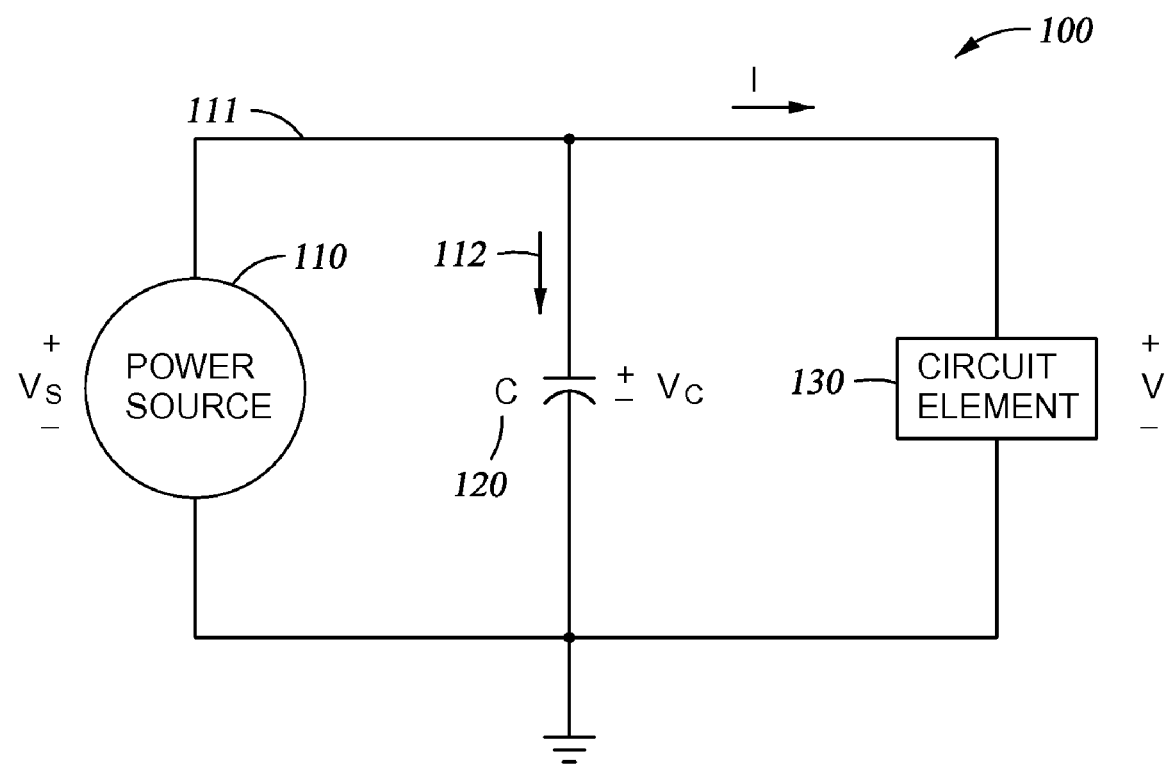
FIG. 1 is a prior art circuit diagram illustrating a decoupling capacitor.

Embodiments of the invention generally provide methods, systems, and apparatus for testing decoupling capacitors of an integrated circuit. A decoupling capacitor may be disconnected from the power grid of the integrated circuit during testing. The voltage of the decoupling capacitor may be compared to the voltage of a reference capacitor to determine whether the decoupling capacitor is defective. If the decoupling capacitor is determined to be defective, the decoupling capacitor is not reconnected to the power grid, thereby reducing the leakage currents in the integrated circuit.

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

Exemplary System

FIG. 1 illustrates an exemplary circuit 100 comprising a decoupling capacitor. As illustrated, circuit 100 may include a power source 110, decoupling capacitor 120, and circuit element 130. Decoupling capacitors are generally placed along power lines. Therefore, the charge buildup on decoupling capacitors results in a voltage across the capacitor that is equal to the voltage supplied by the power source. For example, in FIG. 1, decoupling capacitor 120 is placed on power line 111. Therefore, in a steady state, the voltage (Vs) across the power source 110 is equal to the voltage (Vc) across the decoupling capacitor 120.

Power source 110 provides power to circuit element 130. Accordingly, circuit element 110 is shown consuming current (I) and having a voltage (V) across the circuit element. Rapid switching of transistors in circuit element 130 may require a periodic boost in the current I. Spikes in current consumption, however, may result in fluctuations in the voltage V across circuit element 130. Such voltage fluctuations are undesirable because they may adversely affect high frequency circuits. For example, the voltage fluctuations may result in undesired state changes, functional failures in logic, timing violations, and the like, in circuit element 130.

Placing localized decoupling capacitors along the power grid near a circuit element remedies the above mentioned problems by providing a source of current during spikes in current requirements. Therefore, effects of voltage fluctuations may be made less severe. For example, when a greater amount of current is desired, electrical charge stored in the capacitor may flow to the circuit element, thereby providing an additional source of current. Providing additional current may reduce voltage fluctuations.

Decoupling capacitors are generally placed at strategic locations across most integrated circuits to maintain steady supply voltages. For example, in a Dynamic Random Access Memory (DRAM), a matrix of array capacitors may be placed at one or more locations along the power grid where current spikes may be likely.

With increasing chip densities, the size and proximity of integrated circuit components have been greatly reduced, thereby increasing the risk of defects during fabrication. While some components of an integrated circuit, for example, memory arrays, are tested and repaired using redundant elements or simply disconnected, testing of decoupling capacitors is typically not performed.

A defective decoupling capacitor may result in a short circuit leading to high leakage currents. For example, in FIG. 1, if capacitor 120 was defective, resulting in a short circuit, the supply of power to the circuit element may be hindered due to the leakage of current through current path 112. Traditionally, the problem of defective capacitors has been solved by specifying sufficiently high stand by currents for the device. However, with the emergence of low power integrated circuits (for example, mobile DRAMs, PSRAMS, Cellular RAMs, and the like) stand by and self refresh current specifications have been significantly tightened. With such tight specifications, defects in decoupling capacitors result in high yield losses if defective decoupling capacitors are not disconnected, when defective.

Figure 2:
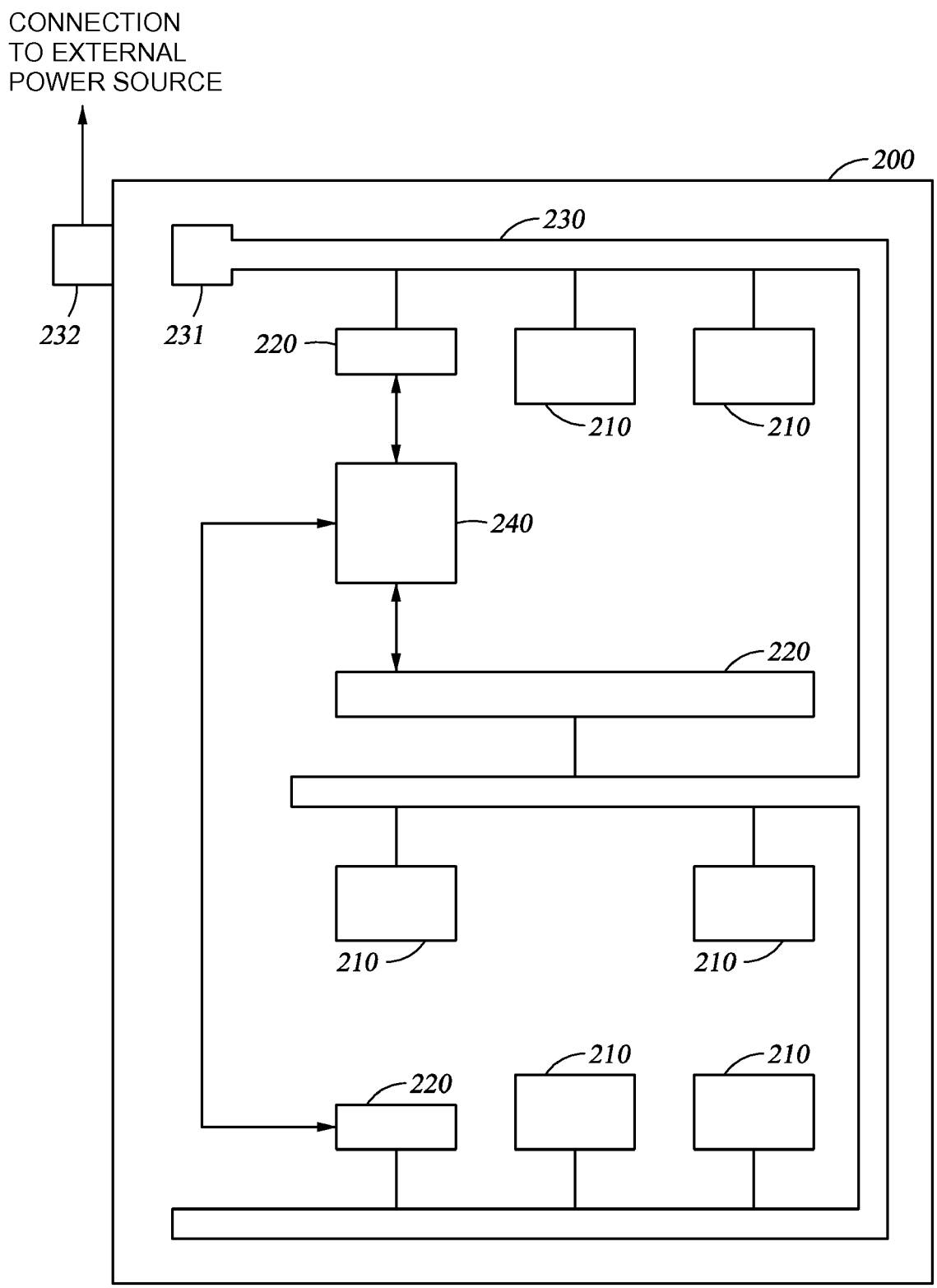
FIG. 2 is an illustration of an exemplary integrated circuit, according to an embodiment of the invention.

FIG. 2 is a block diagram of an exemplary integrated circuit (IC) 200 according to an embodiment of the invention. IC 200 may be formed on a semiconductor material, for example, on a silicon substrate. As illustrated, IC 200 includes a plurality of circuit elements 210, a plurality of decoupling capacitor arrays 220, power grid 230, and a decoupling capacitor tester 240.

Circuit elements 210 may include any combination of semiconductor devices and passive devices. Exemplary semiconductor devices include diodes and transistors (for example, bipolar junction transistors (BJTs), Metal Oxide Semiconductor Field Effect Transistors (MOSFETs), and the like). Semiconductor devices generally require power to perform an intended function. On the other hand, passive components do not require power to perform an intended function. Exemplary passive components include resistors, capacitors, inductors, and the like.

Each circuit element 210 may be connected to power grid 230 to receive power required to operate the circuit element. Power grid 230 may include one or more connector pads 231 to receive input from one or more external power sources. For example, pad 231 may be coupled with a connector pin 232 of IC 200 to which the power source may be connected. Exemplary external power sources include current sources and voltage sources.

One or more capacitor arrays 220 may be placed at strategic locations along the power grid to ensure a steady voltage across one or more circuit elements. In one embodiment, the capacitors in the capacitor arrays 220 may be connected in parallel. However, one skilled in the art will recognize that any type of connection of one or more capacitors, whether in serial or parallel or both, may be implemented to achieve a desired equivalent capacitance.

The capacitors in capacitor array 220 may be trench capacitors, stacked capacitors, gate capacitors, or any other structure that forms a capacitor. Trench capacitors may be formed by etching the capacitors deep in the substrate before forming the circuit elements. Stacked capacitors, on the other hand, may be formed on the substrate after the circuit elements are formed. One skilled in the art will recognize that any combination of trench capacitors, stacked capacitors, gate capacitors, and the like may be implemented on a single integrated circuit. Furthermore, embodiments of the invention are not limited by the size or shapes of the capacitors formed on the substrate.

During operation of IC 200, the switching of one or more transistors in a circuit element 210 may result in the drawing of large amounts of current from the power grid. Because of the inductive characteristics of the circuit elements or connectors to external sources, the spikes in current may result in severe fluctuations in voltage if the decoupling capacitors are not provided. The fluctuations in voltage may be based on the rate of change of current as illustrated by the equation below, $$V = L\frac{di}{dt}$$

wherein V is the voltage provided by the power grid, L is the inductance of the circuit element and di/dt is the rate of change of current. The voltage fluctuations, if severe, may adversely affect performance of the circuit element.

Certain transistor circuits, for example, CMOS transistor circuits, may periodically experience very large local switching currents that are present for the duration of a switching event. The switching event may last a relatively short period of time, for example, 50 ps. The RC delay of a chip power grid and/or an external power connection via bonding wires may be substantially greater than the duration of the switching event, thereby resulting in insufficient current being provided during the switching event and harmful voltage fluctuation.

In some cases, the chip internal voltage may be a regulated voltage that depends on an external voltage supply. The external voltage supply may not provide additional current unless a drop in voltage is detected. If a voltage drop is detected, the external voltage supply may start regulating the voltage to a desired level. However, the time required for regulating the voltage to a desired level may be significantly greater than the duration for which increased current is desired. Therefore, desired voltage levels may not be available during spikes in current requirements.

As previously described, the decoupling capacitors may store energy which may be transferred to the circuit elements during current spikes. For example, the charges built up on capacitor plates may be transferred to the circuit element to provide additional current. Therefore, the effects of voltage fluctuations may be made less severe.

Decoupling capacitor tester 240 may be configured to test each decoupling capacitor 240 on IC 200, and disconnect defective capacitors. Defective capacitors, for example, may include shorted capacitors. Shorted capacitors may leak current during operation of the IC 200, thereby adversely affecting performance.

Exemplary Array Capacitor Structures

Each capacitor array 220 may comprise a plurality of decoupling capacitors. With increasing circuit densities, one goal with respect to the capacitor arrays 220 may be to achieve a maximum amount of capacitance on a minimum footprint, thereby allowing fabrication of compact decoupling capacitors and increasing circuit density. As discussed earlier, to increase capacitance, the plurality of capacitors may be connected in parallel, in one embodiment of the invention.

Figure 3A:
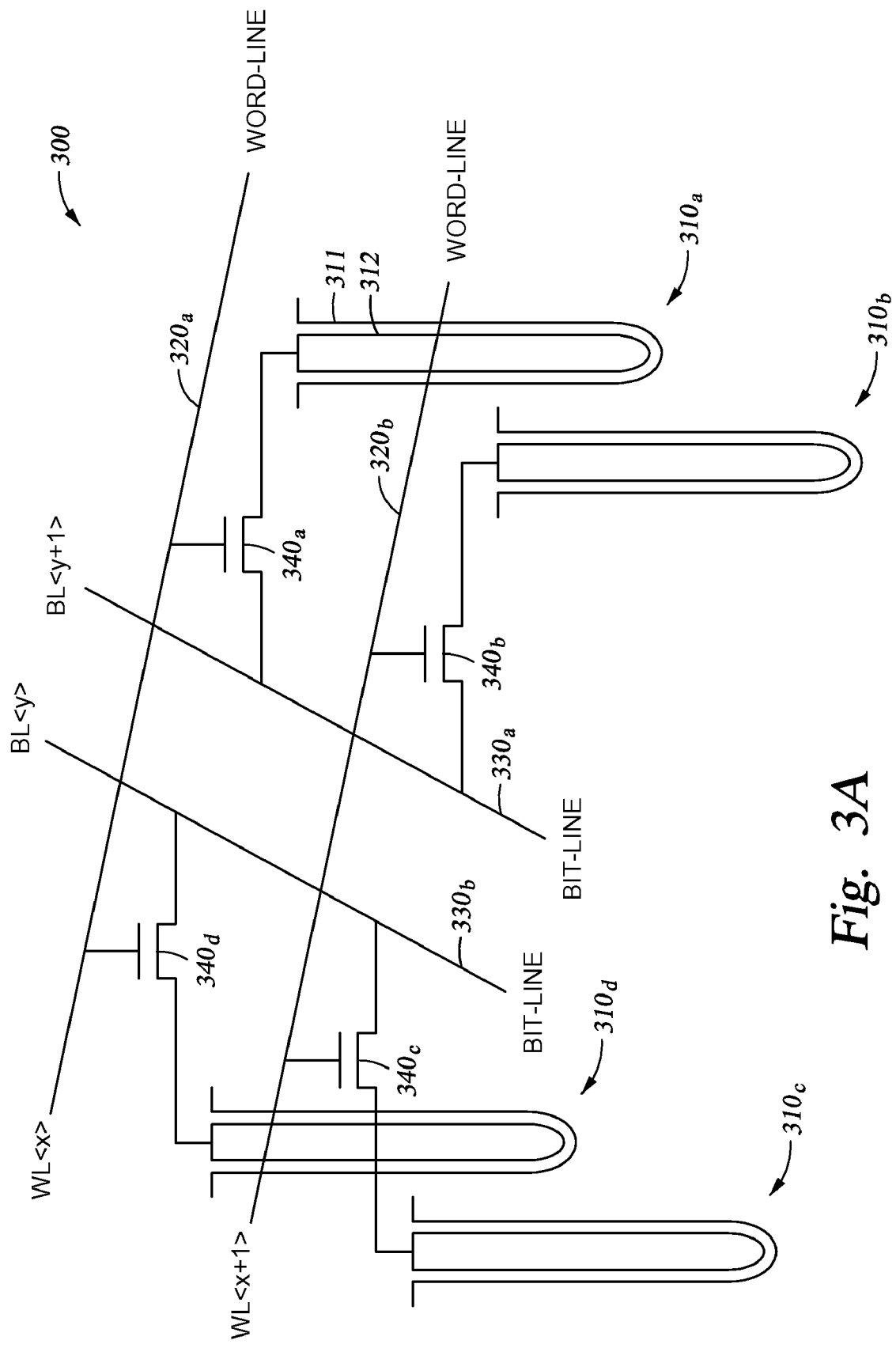
FIGS. 3A-3E illustrate exemplary cell capacitors and defects associated with cell capacitor arrays.

FIG. 3A illustrates a portion of an exemplary decoupling capacitor cell array 300 according to an embodiment of the invention. As illustrated in FIG. 3A, the decoupling capacitor cell array may include a plurality of cells 310, a plurality of parallel word lines 320, and a plurality of parallel bit lines 330. An access transistor 340 associated with each cell 310 may be coupled to a respective word line 320 and bit line 330. The access transistors 340 may control access to the cells 310 using the respective word lines 320 and bit lines 330.

For example, to select decoupling capacitor 310a, word line 320a may be activated and the data on bit line 330a may be amplified or transferred. As discussed earlier, the fabrication of increasingly smaller and denser devices can result in an increase in defects in the devices. One common defect in the cells 310 is a short circuit between the plates 311 and 312 of the cell/capacitor. Such short circuits between plates 311 and 312 can result in the loss of information/charge stored in the cell and in cross-currents from bit line 330a via the inner plate 312 to the outer plate if the word line 320a is selected.

Figure 3B:
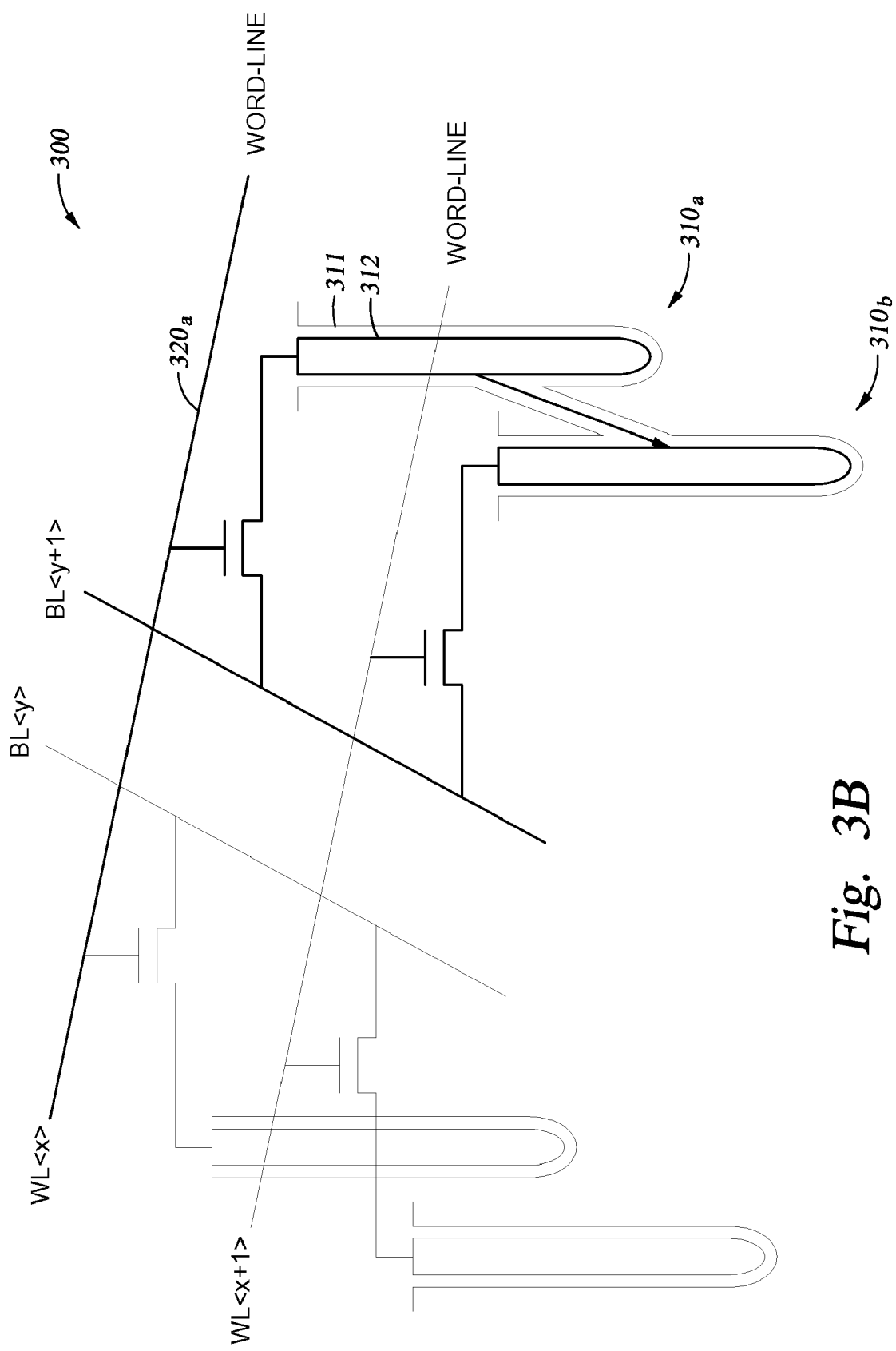

Another common defect is the merging of cells during fabrication. FIG. 3B illustrates the merging of capacitor cells 310a and 310b. Merging of cells may occur if the etching of trenches to form trench capacitors is not properly controlled, thereby resulting in the formation of wide trenches that merge with each other. While merging of cells may not necessarily result in short circuiting of the plates of a capacitor, it may result in an inability to store different data in the merged cells.

Figure 3C:
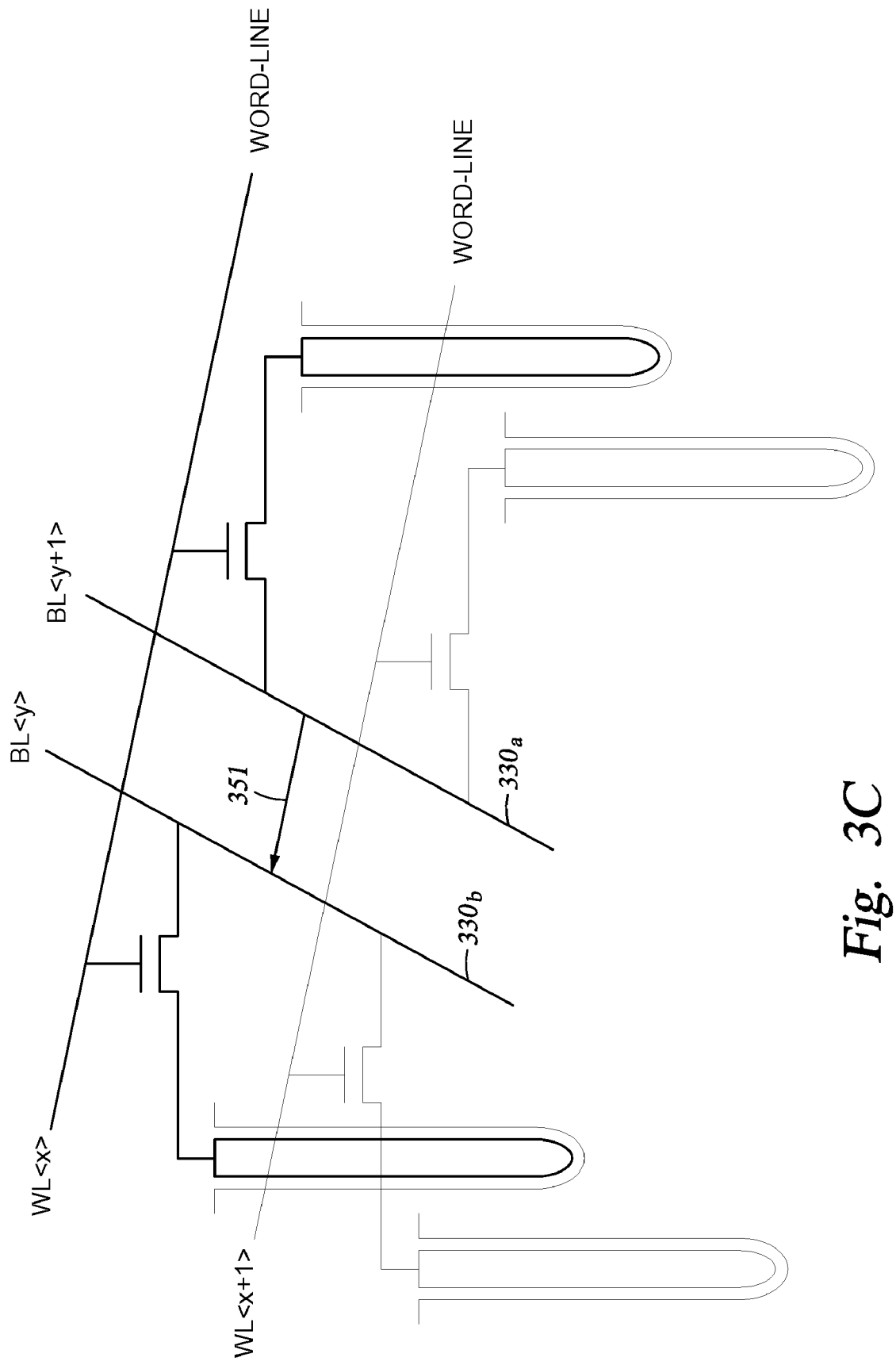
Figure 3D:
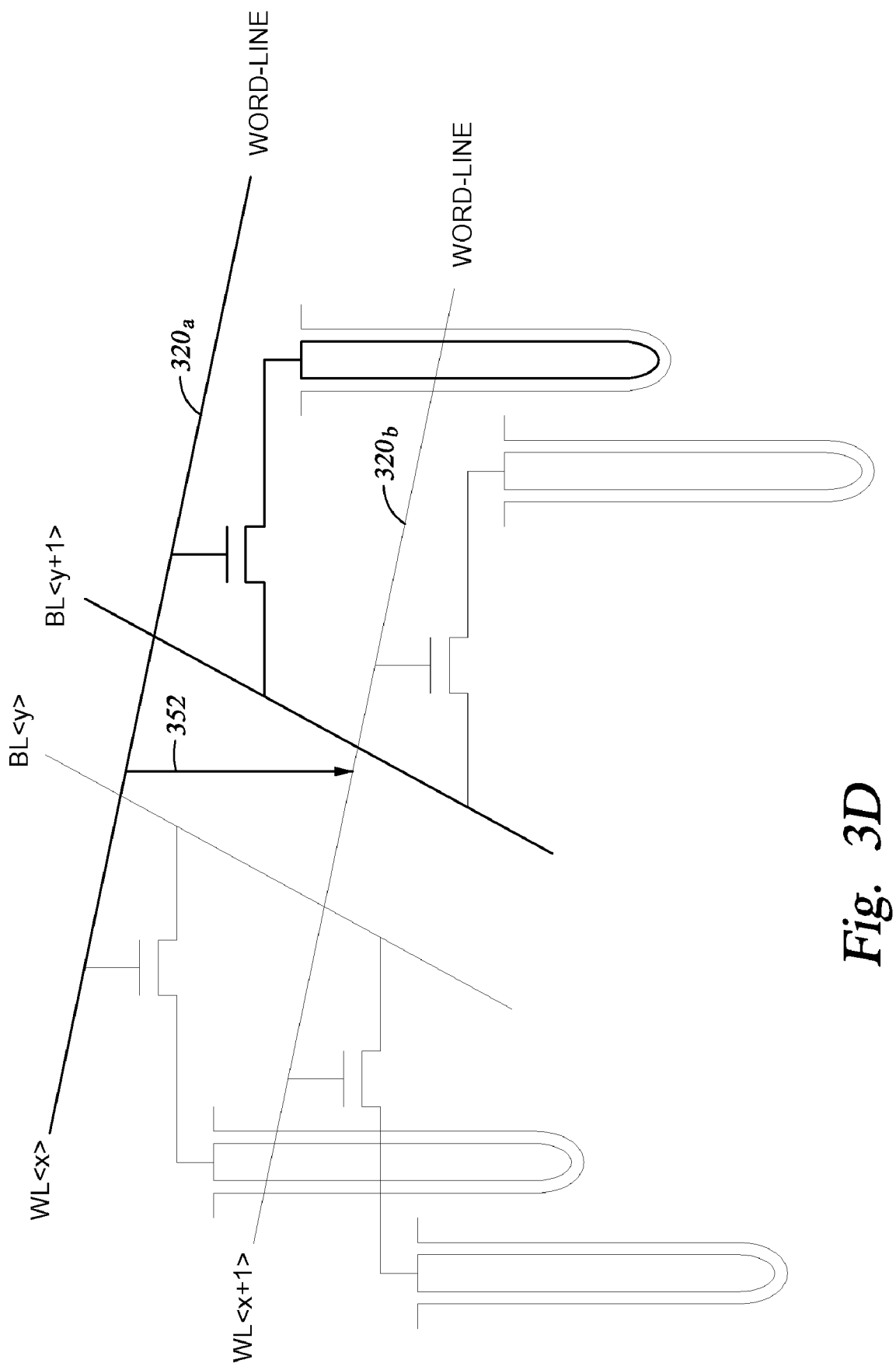

Yet another potential defect is a short circuit between two bit lines. FIG. 3C illustrates a short circuit 351 between bit lines 330a and 330b. The disadvantage of shorted bit lines is that it prevents storage of independent data in cells associated with the shorted bit lines. If a short is present between two word lines, both word lines are activated upon the selection of any one of the shorted word lines. As a result, data from cells associated with one word line may be overwritten or disturbed by data associated with the other word line. FIG. 3D illustrates an exemplary short 352 between word lines 320a and 320b.

Figure 3E:
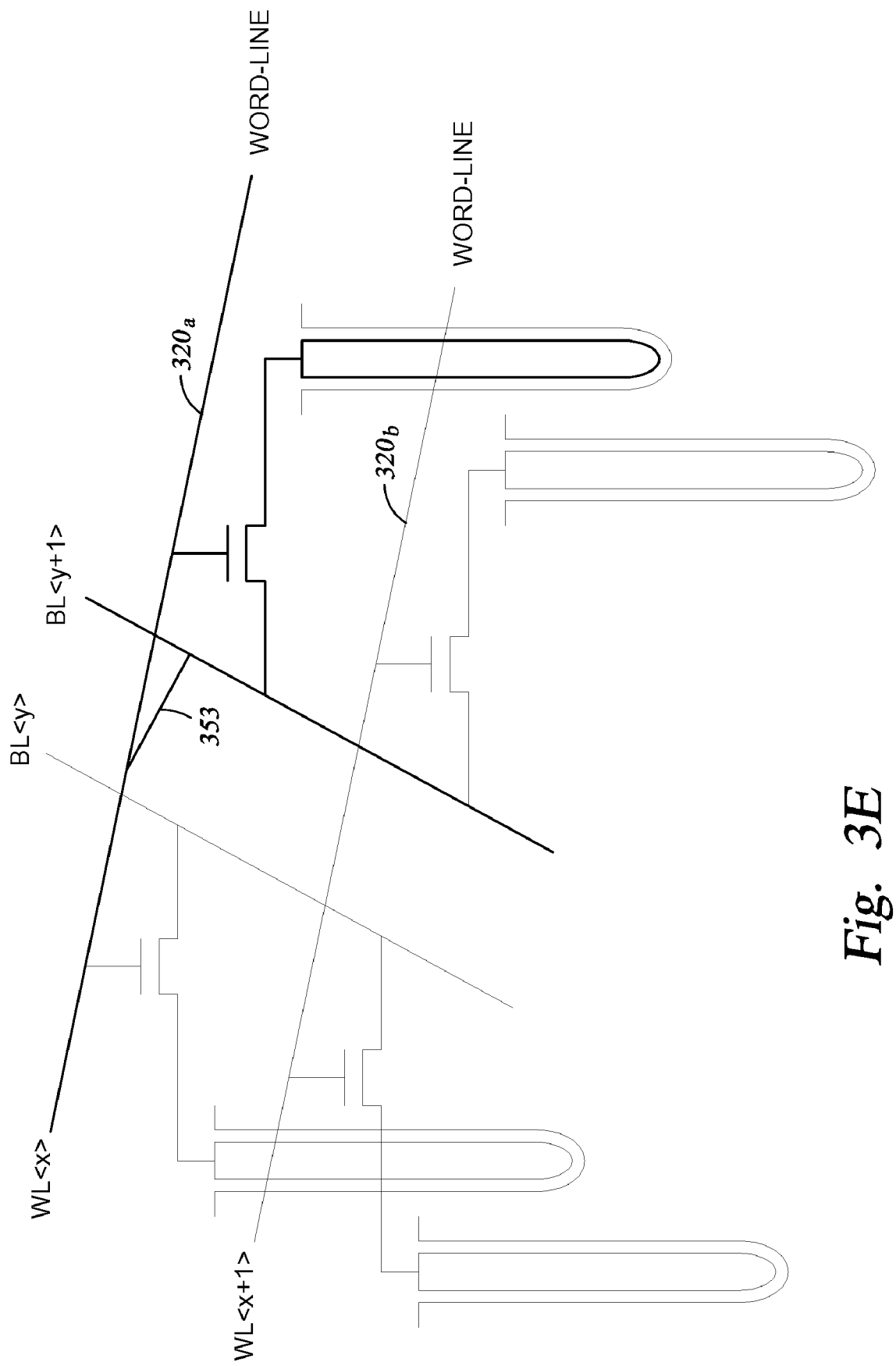

A short between a bit line and a word line may adversely affect the ability to read or transfer data using the bit line. Furthermore, because different voltage levels may be used to select word lines and bit lines, harmful cross currents may flow between a shorted bit line and word line. FIG. 3E illustrates an exemplary short 353 between a word line 320a and bit line 330a.

Figure 4A:
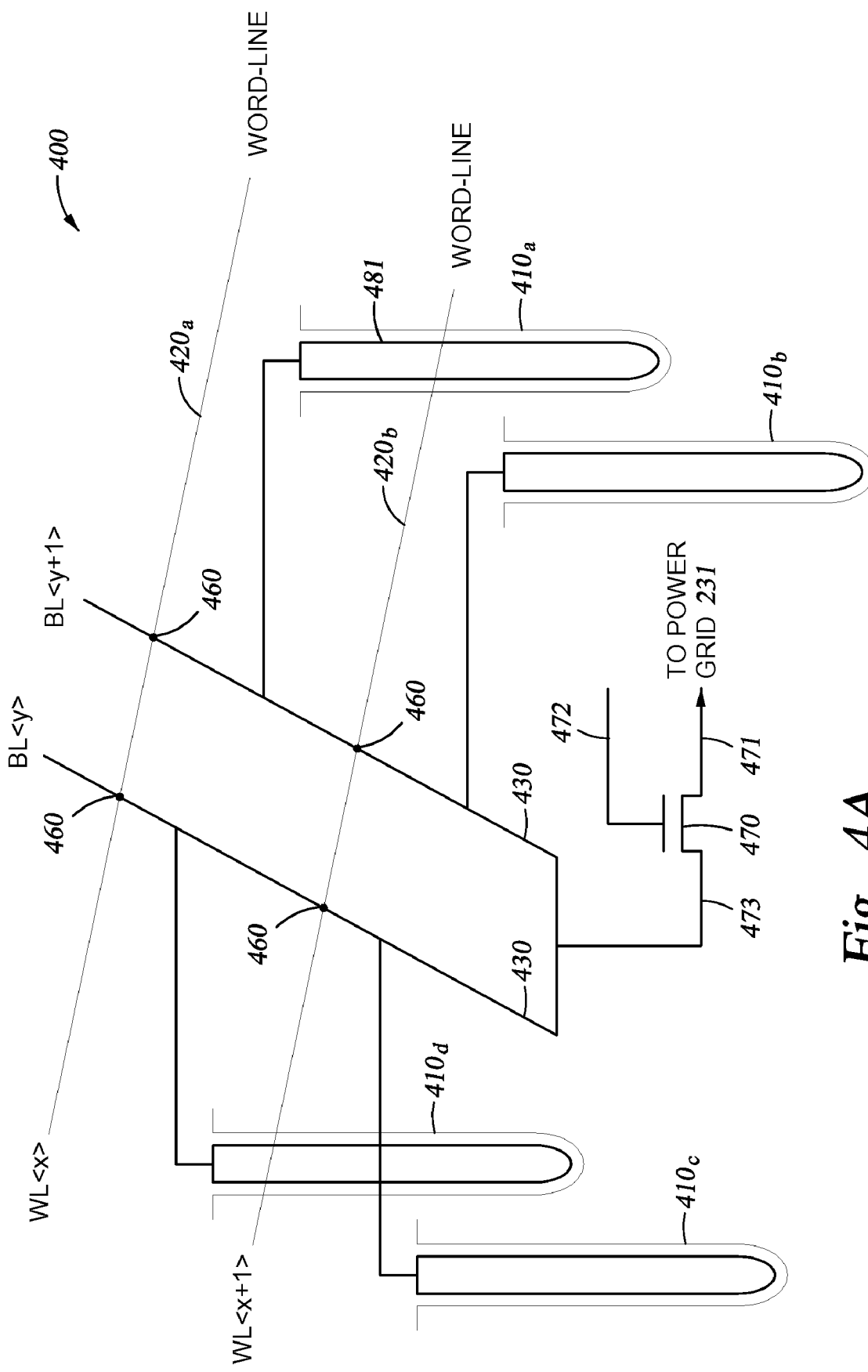
FIGS. 4A-4B illustrate an exemplary decoupling capacitor array according to an embodiment of the invention.

In one embodiment of the invention, access transistors may not be included in the decoupling capacitor array because access to individual decoupling capacitors may not be desired. FIG. 4A illustrates a portion of an exemplary decoupling capacitor array 400 wherein the access transistors are not included. As illustrated in FIG. 4A, the word lines 420 and bit lines 430 may be connected to each other at locations 460 in a mesh like configuration, thereby connecting each capacitor cell 410 in parallel. The equivalent capacitance ($C_{EQ}$) of the decoupling capacitor array comprising n cells may be determined by the sum of individual capacitances ($C_1$, $C_2$, $C_3$, ..., $C_N$) of each cell, as shown in the following equation:

$$C_{EQ} = C_1 + C_2 + C_3 + \ldots + C_N$$

Because the bit lines and word lines are interconnected in a mesh configuration in the embodiment illustrated in FIG. 4A, short circuiting of bit lines, word lines and/or a bit line and a word line as illustrated in FIGS. 3C, 3D, and 3E are not defects with respect to the capacitor array 400. Furthermore, a common voltage potential may be uniformly applied to activate all the bit lines and word lines. However, short circuits between plates of one or more decoupling capacitors, such as, for example, short circuit 481 in FIG. 4A, may still occur and make the decoupling capacitor array 400 ineffective or may at least cause a cross-current that increases the power consumption of the circuit.

Figure 4B:
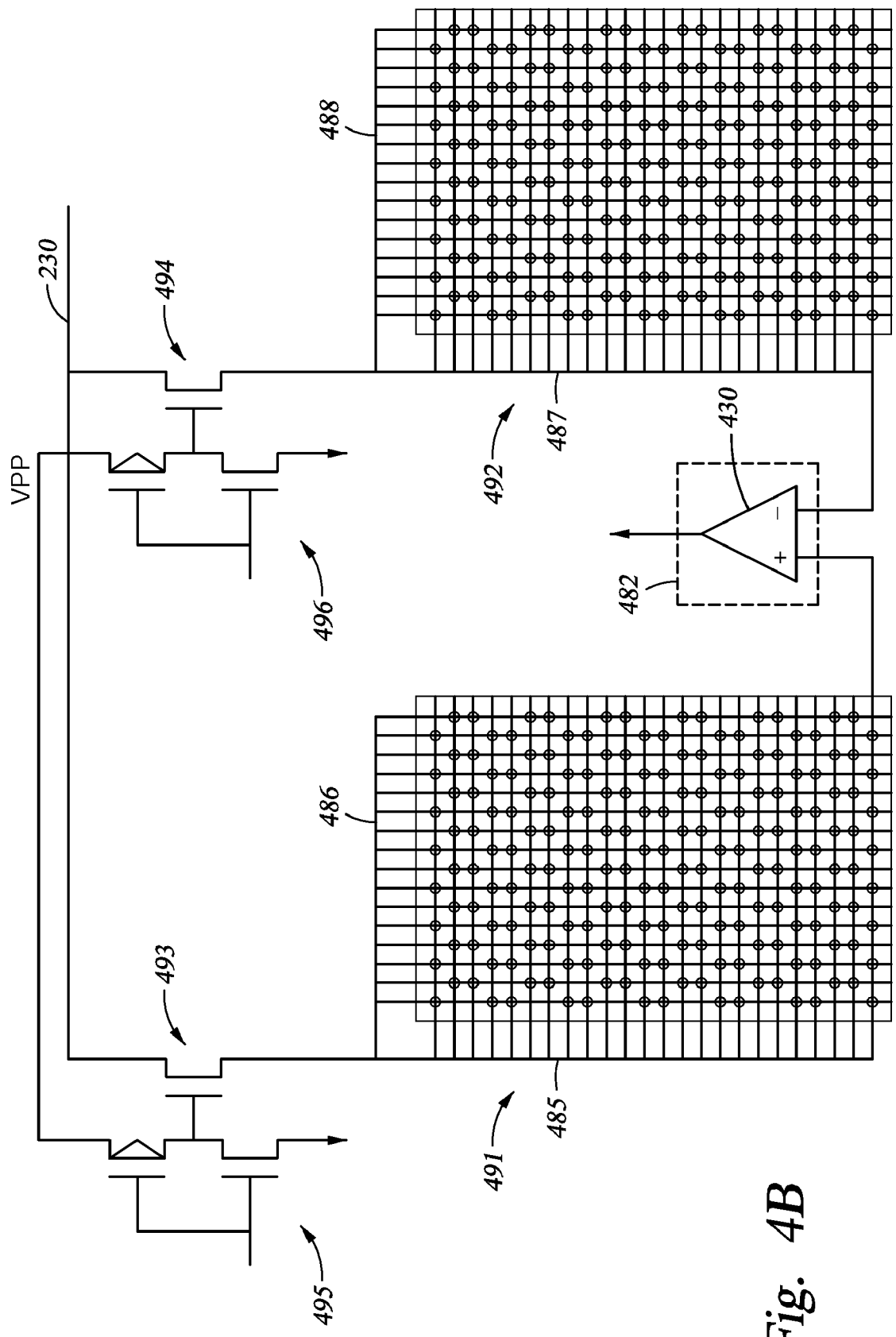

For example, if capacitor plates of a large number of decoupling capacitors become short circuited, current leakage may make the decoupling capacitor array ineffective or even harmful to the operation of an integrated circuit. In one embodiment, an access transistor 470 may be provided to either connect or disconnect a decoupling capacitor array to a power grid. For example, transistor 471 may be connected to a power grid 230 at one end 471 and the decoupling capacitor array 400 at another end 473, as illustrated in FIG. 4B. A control signal 472 may determine whether the transistor 470 connects or disconnects the decoupling capacitor array 400 to the power grid 230.

FIG. 4B illustrates an exemplary circuit diagram for connecting or disconnecting a decoupling capacitor array from a power grid, according to an embodiment of the invention. Two exemplary capacitor arrays 491 and 492 are illustrated in FIG. 4B. In one embodiment, the decoupling capacitors in each of capacitor arrays 491 and 492 may be arranged similar to the decoupling capacitors 410 of FIG. 4A. For example, the decoupling capacitors of capacitor array 491 may be connected in parallel to an interconnected mesh of bit lines 485 and word lines 486.

Furthermore, an access transistor may determine whether a respective capacitor array is connected to the power grid 230. For example, array transistors 493 and 494 determine whether the respective capacitor arrays 491 and 492 are connected to the power grid 230. The size of the access transistors 493 and 494 may be sufficiently large to effectively connect or disconnect the decoupling capacitors of a respective capacitor array from the power grid. The faster the response time of the decoupling capacitor, the more effective it may be in smoothing out voltage fluctuations on the power-grid 230. The response time is the RC-delay of the cell-array/access-transistor structure with the access-transistor's source-drain resistance contributing to the overall resistance. In one embodiment, the chip-area required for the access-transistor may be in the same order of magnitude as the cell-array, for example, when an RC-response of ~1 ns is required.

In one embodiment, each access transistor 493 and 494 may be controlled by a switching device to turn the access transistors on or off, thereby connecting or disconnecting the decoupling capacitor arrays from the power grid. The switching devices may be used as level-shifters to connect the gate of the access-transistors to the highest voltage available on die (on a DRAM typically the Word-line on voltage VPP) in order to reduce its channel resistance and therefore reduce its required size. For example, switching devices 495 and 496 control access transistors 493 and 494, respectively, as illustrated in FIG. 4B. In one embodiment, the switching devices 495 and 496 may be modeled as Complementary Metal Oxide Semiconductor (CMOS) switches, as illustrated in FIG. 4B. However, any other type of switching device, for example, and n-MOS or c-MOS switch may also be used.

The switching devices 495 and 496 may receive a signal from, for example, a fuse latch or a test latch to either connect or disconnect a respective capacitor array from the power grid 230. In one embodiment the signal may be asserted by a person testing the decoupling capacitor. Each of the capacitor arrays 491 and 492 are also shown coupled with a comparison circuit 482. Comparison circuit 482 may include a comparator, as illustrated in FIG. 4B. Alternatively the capacitor arrays may be connected to a reference capacitor, as discussed below.

In one embodiment, the signal received by the switching devices 495 and 496, the test/fuse latches, and the comparison circuit 430 may be a part of the capacitor tester circuit 240, which is described in greater detail in the following section.

Figure 5A:
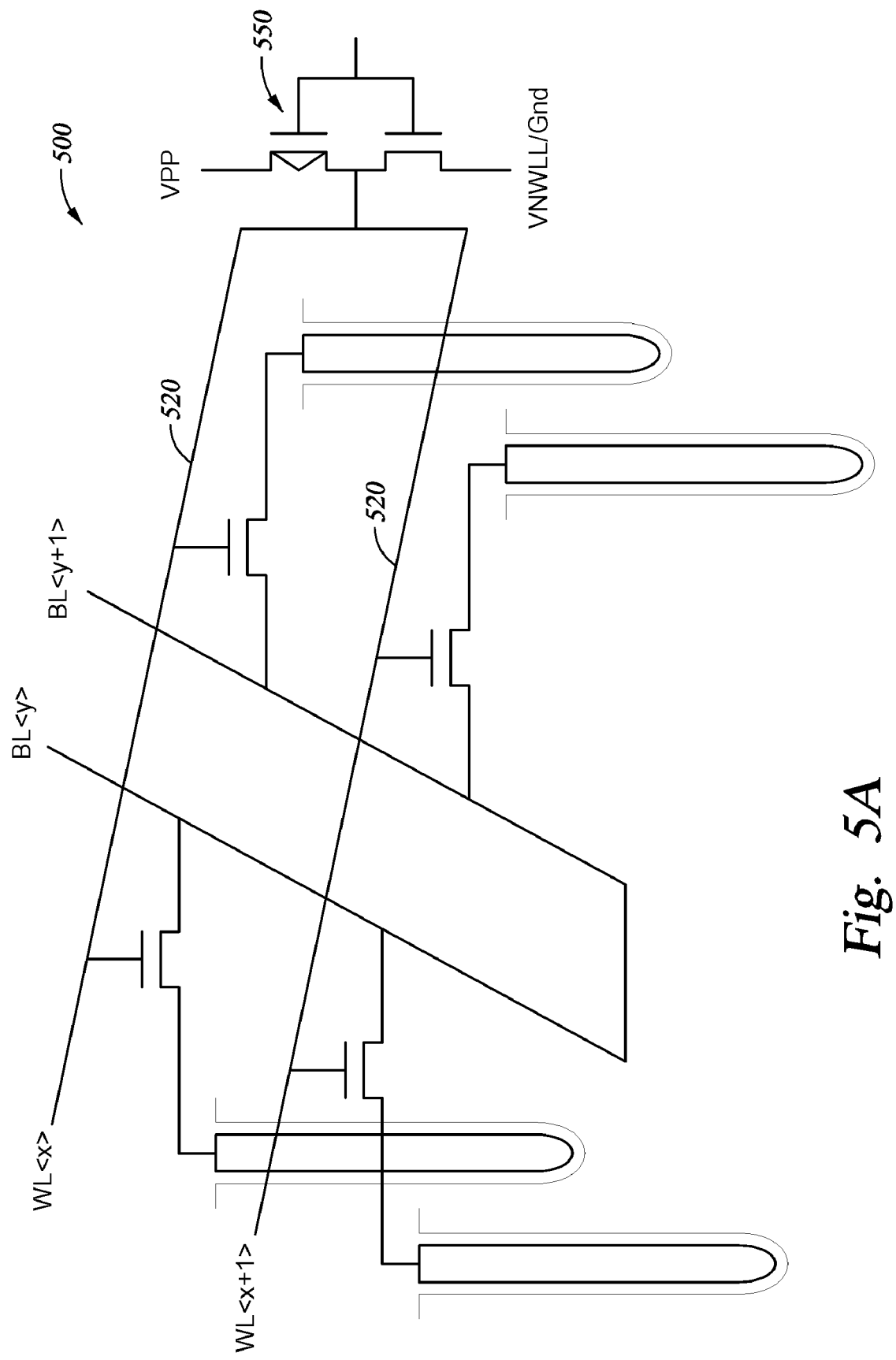
FIGS. 5A-5B illustrate another exemplary decoupling capacitor array according to an embodiment of the invention.

FIG. 5A illustrates another exemplary decoupling capacitor array 500 according to an embodiment of the invention. As illustrated in FIG. 5A, one or more word lines 520 of the decoupling capacitor array 500 may be connected to each other. Furthermore, in some embodiments, one or more bit lines 530 may also be connected to one another. In one embodiment, all bit lines may be connected to one another and all word lines may be connected to one another. Because the bit lines are connected to each other and all word lines are connected to each other, the bit line short circuits and word line short circuits as illustrated in FIGS. 3C and 3D are not defects in decoupling capacitor array 500.

In the embodiment of FIG. 5A (unlike capacitor arrays 491 and 492 illustrated in FIG. 4C) the word lines 520 may not be connected to the bit lines 530 in capacitor array 510. One advantage of having unconnected bit lines and word lines is that the array transistors 540 can be used to either connect or disconnect the decoupling capacitor array to the power grid. These may be the same structures that are used to access individual cells in the cell-array of the DRAM. Each transistor may be located next to (for example, on top or below) a cell without affecting its minimum pitch. Because a large number of transistors may now enabled in parallel, each transistor may have a high channel resistance without affecting the RC-response significantly. No additional access-transistor outside the cell-array may be needed anymore, thereby saving valuable space on an integrated circuit. Referring to FIG. 5A, the small device 550 is used as a selection/deselection device, activating or deactivating the word lines 520, thereby connecting or disconnecting the decoupling capacitors of the decoupling capacitor array 500 to the power grid. The device 550 has the same functionality as the devices 495 and 496 in FIG. 4B.

As discussed earlier, access transistors 493 and 494 in FIG. 4C are required to be at or near the same size as the decoupling capacitor array to work effectively. By leaving the bit lines unconnected from the word lines the array-transistor 540 can be used to connect or disconnect the decoupling capacitor array to the power grid, thereby reducing the footprint of the decoupling capacitors. While the selection/deselection transistor 550 is shown as a CMOS transistor, it should be understood that any other type of switching device, for example, an n-MOS or p-MOS transistor may also be used to activate or deactivate the word lines.

Furthermore, because the bit lines may not be connected to the word lines in the decoupling capacitor array 500, bit line-word line short circuits as illustrated in FIG. 3E that occur during fabrication of the decoupling capacitor array may cause cross currents (The word-line, if selected will be at a voltage higher than the bit-line voltage, and will be 0 if not selected. The bit-line is at the voltage of the power-net the decoupling capacitor is connected to.) In one embodiment, a switching device may be provided to either connect or disconnect the bit lines to the word lines. The word lines may be connected to the bit line voltage if a bit line-word line short exists. This may reduce or eliminate harmful cross currents that make the decoupling capacitor array ineffective. The device that connects bit lines and word lines may be small (similar to the selection/deselction device 550 in FIG. 5A) because it only provides a DC-level (word-line does not switch during normal operation, once the decoupling-capacitor is selected, it will remain selected during operation). The device may be operated during a test-sequence (described in more detail below) where the capacitor is checked for leakage and disconnected if leakage occurs. There may be no requirements for this sequence to be operated at high frequencies, therefore the selection device can be small.

Figure 5B:
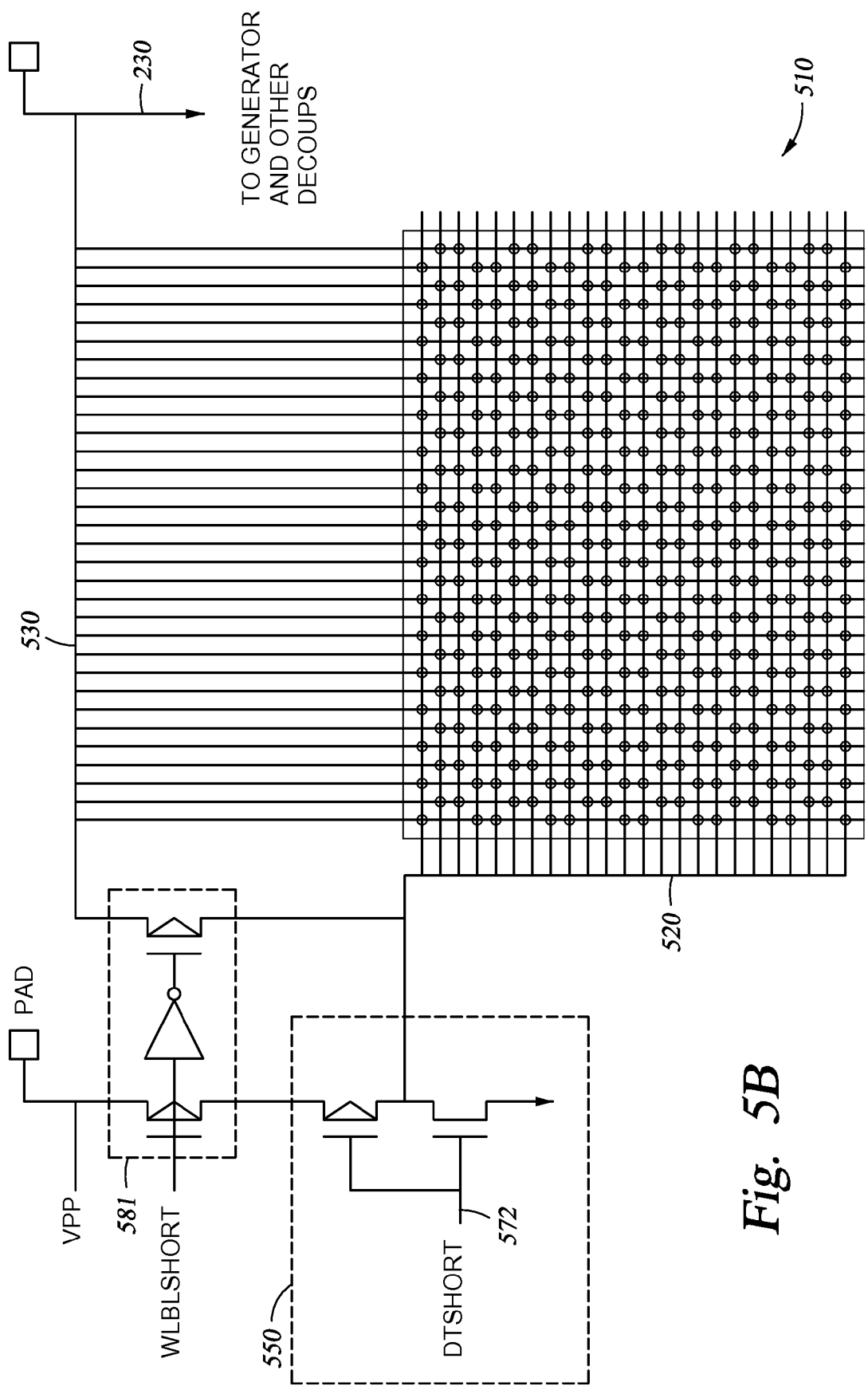

FIG. 5B illustrates one exemplary circuit diagram for connecting or disconnecting the decoupling capacitor array from a power grid with the additional option of shorting the word-lines and bit-lines as described above. Decoupling capacitor array 510 illustrated in FIG. 5B may be arranged similar to the decoupling capacitor array 500 of FIG. 5A. In other words, the bit lines of the decoupling capacitor array 510 may be connected to each other. In one embodiment, word lines of the decoupling capacitor array may also be connected to each other.

As illustrated in FIG. 5B, the bit lines 530 may be coupled to the power grid 230. Word lines 520, when selected may cause associated decoupling capacitors of decoupling capacitor array 510 to be connected to the power grid 230. A selection-transistor 550 may either activate or deactivate the word lines 520 in response to receiving a signal 572. In one embodiment, signal 572 may be received from a test latch or a fuse latch. Alternatively the signal 572 may be either asserted or de-asserted to connect or disconnect the decoupling capacitor array from the power grid during testing. The test latches, fuse latches and the signal 572 that controls connection of the decoupling capacitor array to the power grid are discussed in greater detail in the following section.

A shorting circuit 581 is also provided to either connect or disconnect the word lines 520 to the bit lines 530. Because the word lines 520 may initially not be connected to the bit lines 530, the bit lines and the word lines may be activated using different voltages. Therefore, bit line-word line defects as described with reference to FIG. 3E above may cause harmful cross currents flowing between the bit lines and word lines. Therefore, in one embodiment, the word lines 520 and bit lines 530 may be connected to each other if one or more bit line-word line shorts are detected in the capacitor array 510. Word-line bit-line shorts in a cell-array can be detected during the test-sequences described below by disconnecting the array (drive word-lines low), then letting the word-lines float (or drive low with a very weak bleeder device) and measuring the voltage of the word-line grid after a certain wait period. If one or more word-line bit-line shorts are present, the word-lines will drift towards the voltage of the power-grid that the bit-lines are connected to. Furthermore, the bit lines and word lines may be activated using the same voltage after a shorting circuit 581 connects the bit lines and word lines to prevent the harmful cross currents.

Decoupling Capacitor Testing

Figure 6:
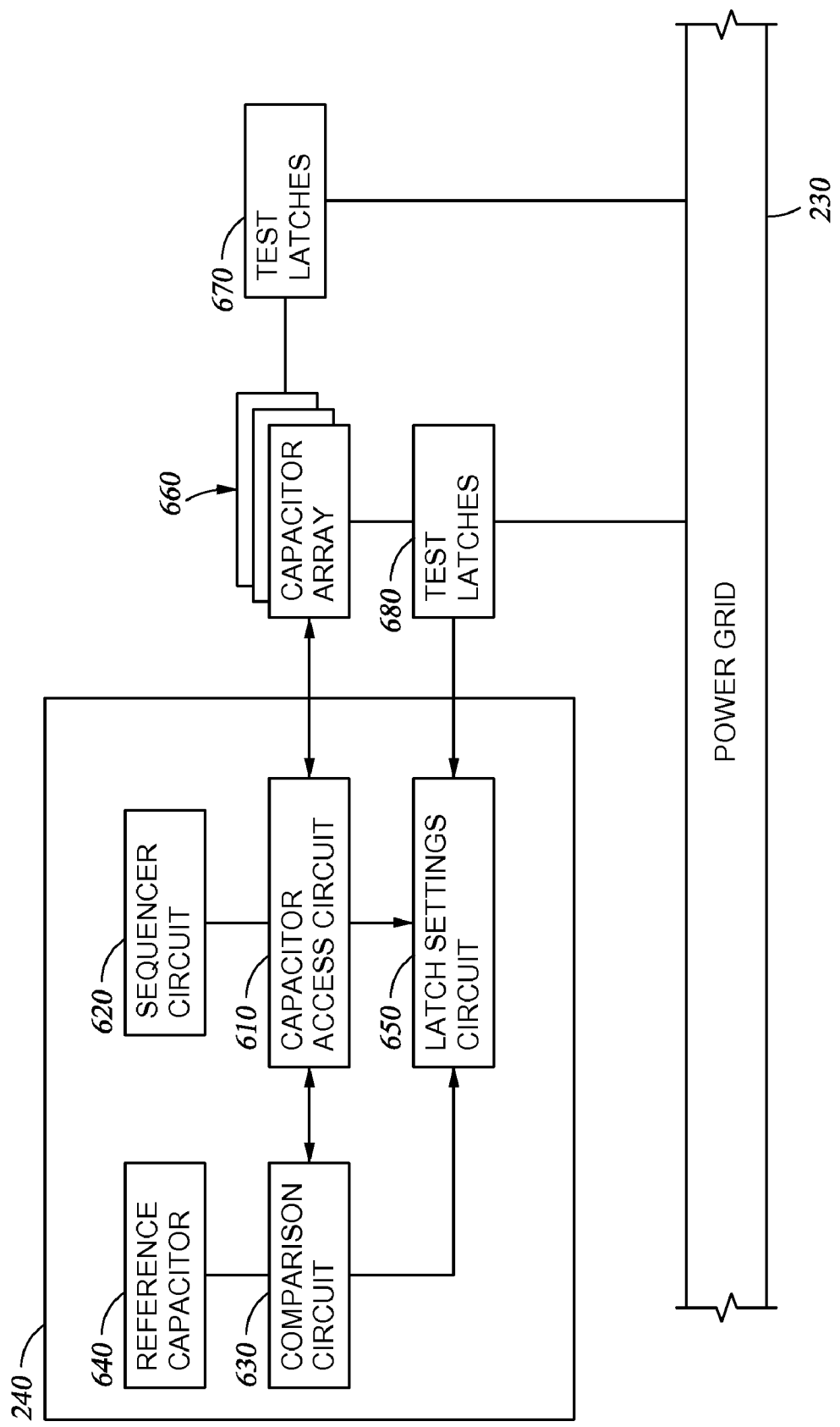
FIG. 6 is an illustration of an exemplary decoupling capacitor tester, according to an embodiment of the invention.

FIG. 6 is a block diagram illustrating the components of an exemplary decoupling capacitor tester 240 (see FIG. 2), according to an embodiment of the invention. As illustrated, capacitor tester 240 includes a capacitor access circuit 610, sequencer circuit 620, comparison circuit 630, reference capacitor 640, and a disconnect circuit 650.

Capacitor access circuit 610 may be configured to individually access each decoupling capacitor array 660. Capacitor array 660 may correspond to the capacitor arrays 220 illustrated in FIG. 2. Each capacitor array 660 may include a one or more capacitors. Each capacitor array 660 may be addressed by a unique address. Therefore, capacitor access circuit 610 may be configured to select a particular capacitor array 660 based on an address associated with the capacitor array. Selecting a capacitor array 660 may involve disconnecting the selected capacitor array 660 from power grid 230, for example, during testing of the capacitor.

In one embodiment, capacitor access circuit 610 may be configured to select a capacitor based on human input. In such embodiments, a production line tester may provide the input identifying a particular capacitor array 660. For example, the tester may provide an address to select the capacitor array 660. In response to receiving the input, capacitor access circuit 610 may disconnect the identified capacitor from the power grid. Furthermore, capacitor access circuit 610 may connect the disconnected capacitor to a device pin or pad to allow an analog read-out of the voltage stored in the capacitor. Therefore, the tester may determine whether the capacitor is defective based on the analog read-out.

In another embodiment, capacitor access circuit 610 may be configured to automatically access the capacitor arrays 660 in a predetermined order based on input from a sequencer circuit 620. Sequencer circuit 620 may be a timer circuit configured to assert a signal to the capacitor access circuit 610 at a given rate. Sequencer circuit 620, for example, may be timed by a free running chip internal time-base. In one embodiment, sequencer circuit 620 may be a refresh oscillator configured to repetitively issue a refresh signal after a predetermined time period. The time period may be sufficiently long to permit the testing of the capacitor to determine whether a capacitor array is defective.

In response to receiving a signal from the sequencer circuit capacitor access circuit 610 may be configured to select a different capacitor array for testing. For example, capacitor access circuit 610 may select a first capacitor array by disconnecting the first capacitor array from power grid 230. The first capacitor array may then be tested. In response to receiving a signal from sequencer circuit 620, capacitor access circuit 610 may re-connect the first capacitor array to the power grid and select a second capacitor array for testing by, for example, disconnecting the second capacitor from power grid 230. Alternatively, if the testing determined that the first capacitor array is defective, capacitor access circuit 610 may not re-connect the first capacitor array to the power grid prior to disconnecting the second capacitor array for testing.

The selection of the second capacitor array may depend on a predetermined order of testing the capacitors. In one embodiment, the order of selection of capacitor arrays may depend on the address of the capacitor array. Accordingly, capacitor access circuit 610 may select the second capacitor array by incrementing the address of the first capacitor array. In this way, some or all of the capacitor arrays 660 may be tested.

Comparison circuit 630 may be configured to test a capacitor array selected by capacitor access circuit 610 and determine whether the capacitor array is defective. For example, comparison circuit 630 may be configured to compare the voltages of a selected decoupling capacitor array and a reference capacitor (or capacitor array) 640. Accordingly, comparison circuit 630 may include a comparator, for example, an operational amplifier, configured to compare the voltages of the selected decoupling capacitor array and the reference capacitor 640. Alternatively, the voltage of the decoupling capacitor array may be compared to a constant voltage signal.

If the voltage of a selected capacitor array is below a certain threshold voltage, indicating a current leaking capacitor array, comparison circuit 630 may determine that the capacitor array is defective. While voltage comparison is disclosed herein, one skilled in the art will recognize that any reasonable means may be used to determine whether a capacitor array is defective. For example, in one embodiment, the effects, on the power grid, of disconnecting the selected decoupling capacitor array may determine whether the decoupling capacitor array is defective. In such embodiments, the comparator may compare one or more electrical characteristics, for example, current flow, on the power grid before and after the decoupling capacitor array is disconnected.

Comparison circuit 630 may also be configured to provide a digital readout of the results of the comparison between a capacitor array 660 and a reference capacitor 640. Therefore, a tester, for example a production line tester, may determine whether the capacitor is defective based on the digital readout and provide input to disconnect the capacitor array from the power grid if the capacitor array is defective.

In one embodiment, IC 200 may include a fuse/fuse latch pair 670 for each decoupling capacitor array. If a decoupling capacitor array is determined to be defective, the fuse associated with the defective decoupling capacitor array may be blown during testing of the IC. A fuse latch associated with each decoupling capacitor array may be configured to read the fuse and store the result, during power up of the integrated circuit. The decoupling capacitor array may either be connected or disconnected from the power grid based on the value stored in the fuse latch. In one embodiment, the identification of defective decoupling capacitor arrays and the blowing of associated fuses may be performed during production line testing of an IC 200.

Sometimes, capacitor arrays that were previously deemed to function properly may become defective later. For example, capacitor arrays may become defective and start leaking current due to aging, temperature fluctuations, high voltages, and the like. Therefore, in some embodiments, a retest sequence may be initiated to test capacitor arrays at regular intervals of time to disconnect previously functional but now defective capacitor arrays. The frequency for testing the capacitor arrays may depend on the type of integrated circuit. For example, integrated circuits used in mobile devices may be subject to greater temperature variations than integrated circuits used in devices placed in offices or homes. Therefore, the capacitor arrays in mobile ICs may be tested more frequently because the risk of capacitors becoming defective is greater.

In some embodiments, capacitor arrays that were previously determined to be defective may also be retested to determine if they are now functioning properly. If a previously defective capacitor array is now functioning properly, the capacitor array may be reconnected to the power grid.

Each retest sequence of capacitor arrays may be performed in the same way as previously described. Accordingly, capacitor access circuit 610 may sequentially access the capacitor arrays 660 based on input from sequencer circuit 620, and comparison circuit 630 may determine whether the selected capacitor array is defective. In one embodiment, only those capacitor arrays that were previously determined to be properly functioning are tested during the retest sequence. However, other types of retest sequences are also contemplated. For example, a retest sequence may retest all capacitor arrays or only the capacitor arrays that were determined to be failing capacitor arrays.

While initiating the retest sequence at regular time intervals is disclosed herein, one skilled in the art will nevertheless recognize that the retest sequence may also be initiated by any asynchronous event. For example, the retest sequence may be initiated in response to user input, increase in temperature, etc.

During testing of a decoupling capacitor array, if the capacitor array is determined to be defective, comparison circuit 630 may notify latch setting circuit 650. Latch setting circuit 650 may be configured to set the value of one or more test latches 680 associated with the decoupling capacitor array. The state of the latch may determine whether the decoupling capacitor is connected or disconnected from the power grid.

For example, when a signal is received from sequencer circuit 620, capacitor access circuit 610, as previously described, may reconnect the decoupling capacitor circuit to the power grid. However, if the value in the test latch 680 associated with the capacitor indicates that the capacitor array is defective, the capacitor array may not be reconnected to the power grid by capacitor access circuit 610, thereby reducing leakage of current caused by the defective decoupling capacitor array.

One skilled in the art will recognize that the fuse/fuse latches 670 may be used in conjunction with test latches 680, as shown in FIG. 3. Such embodiments may allow overriding of fuse latches 670 during subsequent testing by setting the values of test latches 680.

In some embodiments, decoupling capacitor tester 240 may include a control circuit that limits the number of decoupling capacitor arrays that may be concurrently disconnected from the power grid at any time, thereby avoiding a situation in which the power grid becomes unstable due to a large number of decoupling capacitor arrays being disconnected from the grid.

In one embodiment, the control circuit may stop testing when a predetermined number of capacitor arrays have been disconnected, thereby limiting the total number of capacitor arrays disconnected during testing. In other embodiments, the control circuit may be configured to allow testing of all capacitor arrays. The results of the capacitor array testing may be stored in memory. After the testing is completed, the results may be examined to determine the worst performing capacitor arrays. A predetermined number of the worst performing capacitor arrays may then be disconnected from the power grid.

Figure 7:
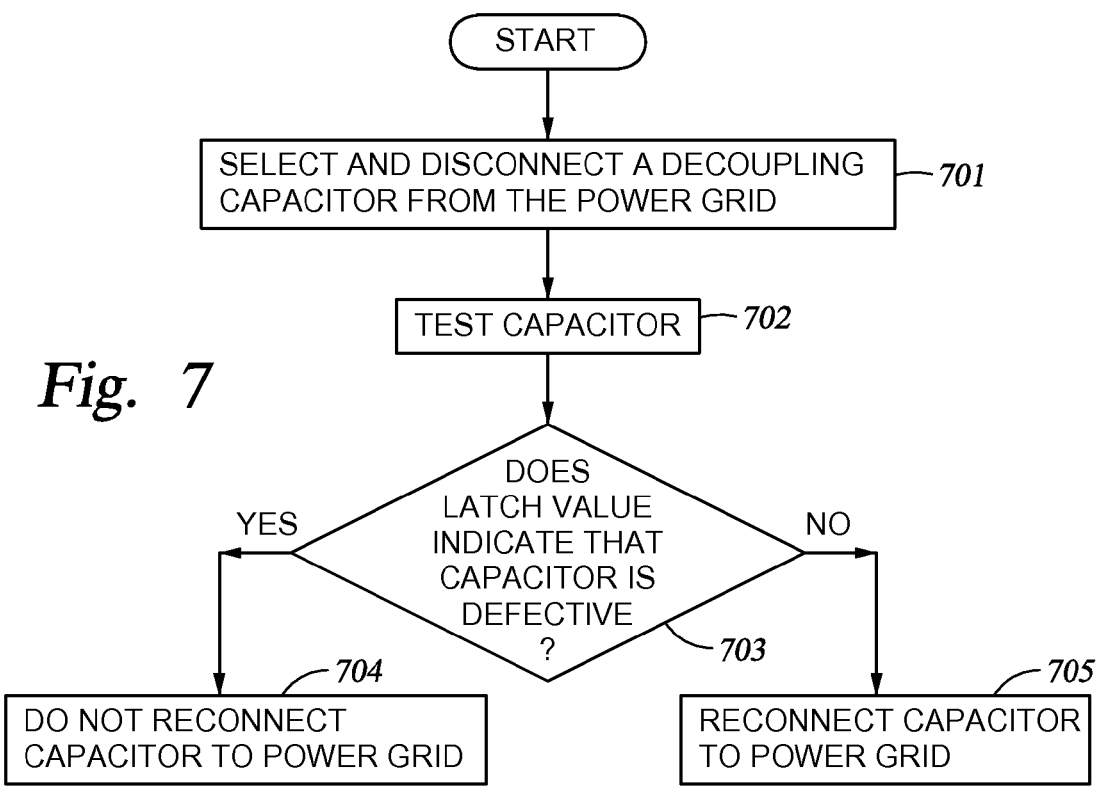
FIG. 7 is a flow diagram of exemplary operations performed by a decoupling capacitor tester, according to an embodiment of the invention.

FIG. 7 is a flow diagram of exemplary operations performed by decoupling capacitor tester 240 to disconnect a defective decoupling capacitor array. The operations begin in step 701 by selecting a decoupling capacitor array and disconnecting a decoupling capacitor array from the power grid. The selection of the decoupling capacitor array may be performed in response to user input, or alternatively, in response to receiving a signal from sequencer circuit 620, for example. In step 702, the capacitor array may be tested to determine whether the capacitor array is defective. Testing the capacitor array may include setting the value of one or more latches associated with the capacitor.

In step 703, one or more latches associated with the decoupling capacitor array to determine whether the decoupling capacitor array is defective. If the value in the latch indicates that the decoupling capacitor array is defective, in step 704, the decoupling capacitor array may not be reconnected to the power grid at the end of testing. On the other hand, if the value in the latch indicates that the decoupling capacitor array is not defective, in step 705, the decoupling capacitor array may be reconnected to the power grid.

Figure 8:
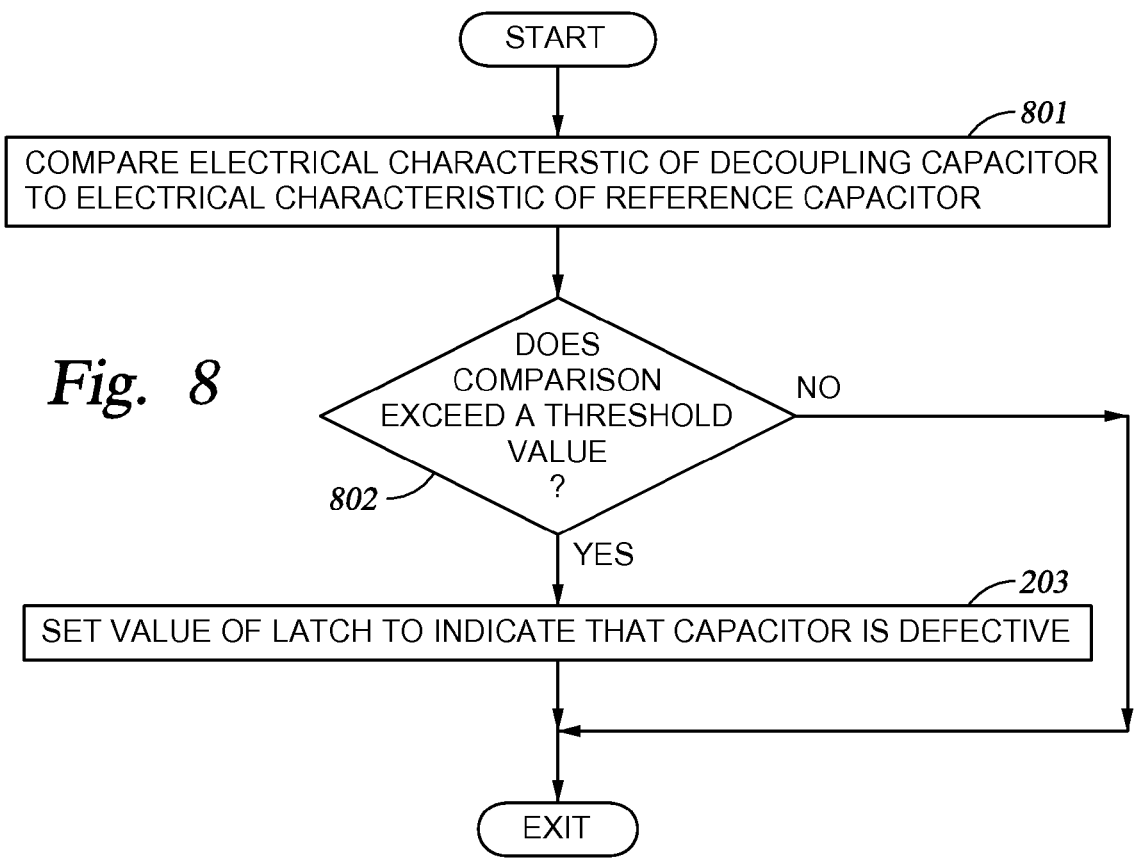
FIG. 8 is a flow diagram of exemplary operations performed by the decoupling capacitor tester to determine whether a decoupling capacitor array is defective, according to an embodiment of the invention.

FIG. 8 is a flow diagram of exemplary operations performed by decoupling capacitor tester 240 to test a selected decoupling capacitor array. The operations begin in step 801 by comparing an electrical characteristic of the decoupling capacitor array with a reference capacitor. For example, in one embodiment, the voltage of the decoupling capacitor array may be compared to the voltage of the reference capacitor.

In step 802, decoupling capacitor tester 240 may determine whether the comparison between the selected decoupling capacitor array and a reference capacitor exceeds a threshold value, indicating that the decoupling capacitor array is defective. For example, decoupling capacitor tester 240 may examine a difference in voltage between the reference capacitor and the selected decoupling capacitor array.

If the threshold value is exceeded, in step 803, the value of a latch associated with the selected decoupling capacitor array may be set to indicate that the capacitor array is defective. If the threshold value is not exceeded, the value of the latch is not set.

CONCLUSION

By allowing decoupling capacitors to be tested and defective capacitors disconnected from the power grid of an integrated circuit, embodiments of the invention greatly reduce undesired leakage currents in the integrated circuit. Therefore, higher yields can be achieved in the manufacture of integrated circuits.

While the foregoing is directed to embodiments of the present invention, other and further embodiments of the invention may be devised without departing from the basic scope thereof, and the scope thereof is determined by the claims that follow.

What is claimed is:

1. A decoupling capacitor array, comprising:
   a plurality of bit lines, wherein the plurality of bit lines are electrically coupled to each other;
   a plurality of word lines, wherein the plurality of word lines are electrically coupled to each other;
   a plurality of decoupling capacitors, each decoupling capacitor coupled to a respective bit line and word line;
   an access circuit electrically coupled to the plurality of word lines and a power grid, wherein the access circuit is configured to either connect or disconnect the decoupling capacitor array to the power grid based on a control signal; and
   a shorting circuit, wherein the shorting circuit is configured to connect the plurality of bit lines and the plurality of word lines based on a shorting signal.

2. The decoupling capacitor array of claim 1, wherein the shorting signal is configured to connect the plurality of bit lines and the plurality of word lines if one or more bit line-word line shorts are detected in the decoupling capacitor array.

3. The decoupling capacitor array of claim 2, wherein if the plurality of bit lines and the plurality of word lines are connected to each other, the plurality of bit lines and the plurality of word lines are activated by the same voltage signal.

4. The decoupling capacitor array of claim 1, wherein the plurality of bit lines are activated by a signal having a first voltage and the plurality of word lines are activated by a signal having a second voltage, the second voltage being different from the first voltage.

5. A decoupling capacitor array, comprising:
   a plurality of bit lines, wherein the plurality of bit lines are electrically coupled to each other;
   a plurality of word lines, wherein the plurality of word lines are electrically coupled to each other;
   a plurality of decoupling capacitors, each decoupling capacitor coupled to a respective bit line and word line; and
   an access circuit electrically coupled to the plurality of word lines and a power grid, wherein the access circuit is configured to either connect or disconnect the decoupling capacitor array to the power grid based on a control signal, wherein the control signal is configured to disconnect the decoupling capacitor array from the power grid if the decoupling capacitor array is determined to be defective.

6. A decoupling capacitor array, comprising:
   a plurality of bit lines, wherein the plurality of bit lines are electrically coupled to each other:
   a plurality of word lines, wherein the plurality of word lines are electrically coupled to each other;
   a plurality of decouplinq capacitors, each decouplinq capacitor coupled to a respective bit line and word line;
   an access circuit electrically coupled to the plurality of word lines and a power grid, wherein the access circuit is configured to either connect or disconnect the decoupling capacitor array to the power grid based on a control signal, wherein the control signal is received from a storage element, wherein a value stored in the storage element is set by a decoupling capacitor testing circuit configured to test the decoupling capacitor arrays.

7. A method for providing decoupling capacitance, comprising connecting a decoupling capacitor array to a power grid of a system, wherein each decoupling capacitor array comprises:
   a plurality of bit lines, wherein the plurality of bit lines are electrically coupled to each other;
   a plurality of word lines, wherein the plurality of word lines are electrically coupled to each other;
   a plurality of decoupling capacitors, each decoupling capacitor coupled to a respective bit line and word line; and
   an access circuit electrically coupled to the plurality of word lines and a power grid, wherein the access circuit is configured to either connect or disconnect the decoupling capacitor array to the power grid based on a control signal; the method further comprising:
   disconnecting the decoupling capacitor array from the power grid if it is determined that the decoupling capacitor array is defective, wherein disconnecting the decoupling capacitor array comprises altering the control signal.

8. A method for providing decoupling capacitance, comprising connecting a decoupling capacitor array to a power grid of a system, wherein each decoupling capacitor array comprises:
   a plurality of bit lines, wherein the plurality of bit lines are electrically coupled to each other;
   a plurality of word lines, wherein the plurality of word lines are electrically coupled to each other;
   a plurality of decouplinq capacitors, each decouplinq capacitor coupled to a respective bit line and word line;
   an access circuit electrically coupled to the plurality of word lines and a power grid, wherein the access circuit is configured to either connect or disconnect the decoupling capacitor array to the power grid based on a control signal; and a shorting circuit, wherein the shorting circuit is configured to connect the plurality of bit lines and the plurality of word lines based on a shorting signal.

9. The method of claim 8, wherein the shorting signal is configured to connect the plurality of bit lines and the plurality of word lines if one or more bit line-word line shorts are detected in the decoupling capacitor array.

10. The method of claim 9, further comprising, activating the plurality of bit lines and the plurality of word lines using the same voltage signal if the plurality of bit lines and the plurality of word lines are connected to each other.

11. The method of claim 9, further comprising activating the plurality of bit lines using a signal having a first voltage and activating the plurality of word lines using a signal having a second voltage, the second voltage being different from the first voltage.

12. A system, comprising:
a power grid;
a plurality of circuit elements coupled to the power grid, the circuit elements comprising one or more transistors; and
a plurality of decoupling capacitor arrays coupled to the power grid, wherein each decoupling capacitor array comprises:
 a plurality of bit lines, wherein the plurality of bit lines are electrically coupled to each other;
 a plurality of word lines, wherein the plurality of word lines are electrically coupled to each other;
 a plurality of decoupling capacitors, each decoupling capacitor coupled to a respective bit line and word line;
 an access circuit electrically coupled to the plurality of word lines and a power grid, wherein the access circuit is configured to either connect or disconnect the decoupling capacitor array to the power grid based on a control signal; and
 a shorting circuit, wherein the shorting circuit is configured to connect the plurality of bit lines and the plurality of word lines based on a shorting signal.

13. The system of claim 12, wherein the shorting signal is configured to connect the plurality of bit lines and the plurality of word lines if one or more bit line-word line shorts are detected in the decoupling capacitor array.

14. The system of claim 13, wherein if the plurality of bit lines and the plurality of word lines are connected to each other, the plurality of bit lines and the plurality of word lines are configured to be activated by the same voltage signal.

15. The system of claim 12, wherein the plurality of bit lines are activated by a first voltage signal and the plurality of word lines are activated by a second voltage signal.

16. A system, comprising:
a power grid;
a plurality of circuit elements coupled to the power grid, the circuit elements comprising one or more transistors; and
a plurality of decoupling capacitor arrays coupled to the power grid, wherein each decoupling capacitor array comprises:
 a plurality of bit lines, wherein the plurality of bit lines are electrically coupled to each other;
 a plurality of word lines, wherein the plurality of word lines are electrically coupled to each other;
 a plurality of decoupling capacitors, each decoupling capacitor coupled to a respective bit line and word line; and
 an access circuit electrically coupled to the plurality of word lines and a power grid, wherein the access circuit is configured to either connect or disconnect the respective decoupling capacitor array to the power grid based on a control signal, wherein the control signal is configured to disconnect the decoupling capacitor array from the power grid if the decoupling capacitor array is determined to be defective.

17. A system, comprising:
a power grid;
a plurality of circuit elements coupled to the power grid, the circuit elements comprising one or more transistors;
a plurality of decoupling capacitor arrays coupled to the power grid, wherein each decoupling capacitor array comprises:
 a plurality of bit lines, wherein the plurality of bit lines are electrically coupled to each other;
 a plurality of word lines, wherein the plurality of word lines are electrically coupled to each other;
 a plurality of decoupling capacitors, each decoupling capacitor coupled to a respective bit line and word line; and
 an access circuit electrically coupled to the plurality of word lines and a power grid, wherein the access circuit is configured to either connect or disconnect the respective decoupling capacitor array to the power grid based on a control signal; and
a decoupling capacitor testing circuit configured to test the decoupling capacitor arrays and set values in one or more storage elements, the storage elements generating the control signal.

18. The decoupling capacitor array of claim 5, wherein the plurality of bit lines are activated by a signal having a first voltage and the plurality of word lines are activated by a signal having a second voltage, the second voltage being different from the first voltage.

19. The system of claim 16, wherein the plurality of bit lines are activated by a first voltage signal and the plurality of word lines are activated by a second voltage signal.

* * * * *